(12) United States Patent
Inoue

(10) Patent No.: US 7,031,194 B2
(45) Date of Patent: Apr. 18, 2006

(54) NONVOLATILE SEMICONDUCTOR MEMORY AND METHOD FOR CONTROLLING THE SAME

(75) Inventor: Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 49 days.

(21) Appl. No.: 10/915,363

(22) Filed: Aug. 11, 2004

(65) Prior Publication Data
US 2005/0068823 A1 Mar. 31, 2005

(30) Foreign Application Priority Data
Aug. 29, 2003 (JP) .............................. 2003-305748

(51) Int. Cl.
*G11C 16/06* (2006.01)
(52) U.S. Cl. .......................... 365/185.23; 365/185.28; 365/185.22
(58) Field of Classification Search ........... 365/185.23, 365/185.28, 185.22
See application file for complete search history.

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,044,022 A | 3/2000 | Nachumovsky | |
| 6,081,454 A * | 6/2000 | Ohuchi et al. | 365/185.22 |
| 6,081,456 A | 6/2000 | Dadashev | |
| 6,177,318 B1 | 1/2001 | Ogura et al. | |
| 6,191,445 B1 | 2/2001 | Fujiwara | |
| 6,248,633 B1 | 6/2001 | Ogura et al. | |
| 6,255,166 B1 | 7/2001 | Ogura et al. | |
| 6,331,952 B1 | 12/2001 | Wang et al. | |

(Continued)

FOREIGN PATENT DOCUMENTS

JP A-7-161851 6/1995

(Continued)

OTHER PUBLICATIONS

Yutaka Hayashi et al.; "Twin MONOS Cell with Dual Control Gates," 2000, IEEE VLSI Technology Digest., 2 pages.

(Continued)

*Primary Examiner*—Tuan T. Nguyen
(74) *Attorney, Agent, or Firm*—Oliff & Berridge, PLC

(57) ABSTRACT

A nonvolatile semiconductor memory that reduces disturbing voltage to a non-selected memory cell during a write operation. The nonvolatile semiconductor memory according to exemplary embodiments of the present invention include a memory cell array, a word line control circuit, and a line control circuit. The memory cell array includes a plurality of memory cells provided in matrix form, a plurality of word lines, a plurality of bit lines, and a plurality of source lines. The word line control circuit controls the plurality of word lines. The line control circuit controls the plurality of bit lines and the plurality of source lines. Each of the memory cells includes a gate electrode coupled to the word lines, a first impurity region, a second impurity region, and an electron trap region provided in between the gate electrode and a substrate. The electron trap region is provided at least on the first impurity region side of the first impurity region side and the second impurity region side. During a write operation in a selected memory cell, the word line control circuit supplies a selection voltage to a selected word line coupled to the selected memory cell, and also supplies an erase-error preventing voltage to a non-selected word line.

15 Claims, 10 Drawing Sheets

U.S. PATENT DOCUMENTS

| | | | |
|---|---|---|---|
| 6,542,410 B1 * | 4/2003 | Hirano | 365/185.3 |
| 6,574,147 B1 * | 6/2003 | Tanaka et al. | 365/185.22 |
| 6,587,380 B1 | 7/2003 | Kanai et al. | |
| 6,587,381 B1 | 7/2003 | Kanai et al. | |
| 6,704,224 B1 | 3/2004 | Natori | |
| 6,738,310 B1 * | 5/2004 | Kato et al. | 365/185.11 |

FOREIGN PATENT DOCUMENTS

| | | |
|---|---|---|
| JP | B1-2978477 | 9/1999 |
| JP | 2000 138300 | 5/2000 |
| JP | 2001 024075 | 1/2001 |
| JP | 2001 101880 | 4/2001 |
| JP | A-2001-156188 | 6/2001 |

OTHER PUBLICATIONS

Kuo-Tung Chang et al., "A New SONOS Memory Using Source-Side Injection for Programming," IEEE Electronic Device Letters, vol. 19, No. 7, Jul. 1998, pp 253-255.

Wei-Ming Chen et al., "A Novel Flash Memory Device with S Plit Gate Source Side Injection and ONO Charge Storage Stack (SPIN)," 1997, VLSI Technical Digest, pp 63-64.

* cited by examiner

FIG.5

| | | MEMORY CELL m1-1 | MEMORY CELL m1-2 |
|---|---|---|---|
| WRITE | WORD LINE | SELECTED WORD LINE (WL1) 11V | NON-SELECTED WORD LINE (WL2) 0.5V |
| | BIT LINE | BL1 5.5V | BL1 5.5V |
| | SOURCE LINE | SL1 0V | SL1 0V |
| ERASE | WORD LINE | WL1 0V | WL2 0V |
| | BIT LINE | BL1 8V | BL1 8V |
| | SOURCE LINE | SL1 0V | SL1 0V |
| READ | WORD LINE | SELECTED WORD LINE (WL1) 3V | NON-SELECTED WORD LINE (WL2) 0V |
| | BIT LINE | BL1 0V | BL1 0V |
| | SOURCE LINE | SL1 2V | SL1 2V |

NONVOLATILE SEMICONDUCTOR MEMORY AND METHOD FOR CONTROLLING THE SAME

RELATED APPLICATIONS

The present application claims priority to Japanese Patent Application No. 2003-305748 filed Aug. 29, 2003 which is hereby expressly incorporated by reference herein in its entirety.

BACKGROUND OF THE INVENTION

1. Field of Invention

The present invention relates to a nonvolatile semiconductor memory and a method for controlling the same.

2. Description of Related Art

The related art includes various types of nonvolatile semiconductor memories. One such related art memory is a MONOS (metal-oxide-nitride-oxide-semiconductor/-substrate) nonvolatile semiconductor memory (see U.S. Pat. No. 6,044,022 and U.S. Pat. No. 6,081,456). This type of memory has an electron trap region between the gate electrode and substrate of its memory element. The amount of electrons in the trap region is controlled by electric-field control. The electrons in the trap region being stored for a long period of time, this type of memory works as a nonvolatile memory.

This type of memory, however, possibly involves write errors and erase errors to and from non-selected memory elements under the influence of disturbing voltage. In order to address this problem, the related art sacrifices the packaging density and access speed of memory elements in related art.

SUMMARY OF THE INVENTION

An exemplary aspect of the present invention reduces the influence of disturbing voltage on memory elements.

Exemplary embodiments of the present invention include a nonvolatile semiconductor memory including a memory cell array, a word line control circuit, and a line control circuit. The memory cell array includes a plurality of memory cells provided in matrix form, a plurality of word lines, a plurality of bit lines, and a plurality of source lines. The word line control circuit controls the plurality of word lines. The line control circuit controls the plurality of bit lines and the plurality of source lines. Each of the plurality of memory cells includes a gate electrode coupled to the word lines, a first impurity region coupled to the bit lines, a second impurity region coupled to the source lines, and an electron trap region provided in between the gate electrode and a substrate. The electron trap region is provided at least on the first impurity region side of the first impurity region side and the second impurity region side. During a write operation in a selected memory cell, the word line control circuit supplies a selection voltage to a selected word line coupled to the selected memory cell. The word line control circuit also supplies an erase-error preventing voltage to a non-selected word line coupled to each non-selected memory cell commonly coupled to a bit line that is coupled to the selected memory cell. This configuration makes it possible to reduce an influence of disturbing voltage in the write operation.

In one exemplary aspect of the present invention, the word line control circuit may supply a positive voltage that is lower than the selection voltage as the erase-error preventing voltage. This configuration makes it possible to reduce or prevent write errors in non-selected memory cells in the write operation.

In another exemplary aspect of the present invention, the word line control circuit may supply a voltage that is lower than a gate threshold voltage of a memory cell under a write operation as the erase-error preventing voltage. This configuration makes it possible to reduce an influence of disturbing voltage, while hardly increasing the amount of electrons trapped in non-selected memory cells in the write operation.

In another exemplary aspect of the present invention, the word line control circuit may supply a voltage that is lower than a gate threshold voltage of a memory cell under a erase operation as the erase-error preventing voltage. This configuration makes it possible to reduce or prevent erase errors in non-selected memory cells in the write operation.

In another exemplary aspect of the present invention, during an erase operation in the selected memory cell, the word line control circuit may supply an erase voltage that is lower than the erase-error preventing voltage to a word line coupled to the selected memory cell.

In another exemplary aspect of the present invention, the trap region may be formed in a nitride film provided in between a first oxide film and a second oxide film.

In another exemplary aspect of the present invention, the trap region may be formed in a silicon dot region provided in between a first oxide film and a second oxide film.

Exemplary embodiments of the present invention also provide a method for controlling a nonvolatile semiconductor memory including, during a write operation in a selected memory cell, supplying a selection voltage to a gate electrode of the selected memory cell and supplying an erase-error preventing voltage to a gate electrode of each non-selected memory cell commonly coupled to a bit line that is coupled to the selected memory cell. The nonvolatile semiconductor memory includes a memory cell array including a plurality of memory cells provided in matrix form, a plurality of word lines, a plurality of bit lines, and a plurality of source lines. Each of the plurality of memory cells includes the gate electrode coupled to the word lines, a first impurity region coupled to the bit lines, a second impurity region coupled to the source lines, and an electron trap region provided in between the gate electrode and a substrate. The electron trap region is provided at least on the first impurity region side of the first impurity region side and the second impurity region side.

In another exemplary aspect of the present invention, the method may include the supplying of a positive voltage that is lower than the selection voltage as the erase-error preventing voltage.

In another exemplary aspect of the present invention, the method may include the supplying of a voltage that is lower than a gate threshold voltage of a memory cell under a write operation as the erase-error preventing voltage.

In another exemplary aspect of the present invention, the method may include the supplying of a voltage that is lower than a gate threshold voltage of a memory cell under a erase operation as the erase-error preventing voltage.

In another exemplary aspect of the present invention, the method may include the supplying of an erase voltage that is lower than the erase-error preventing voltage to a word line coupled to the selected memory cell during an erase operation in the selected memory cell.

BRIEF DESCRIPTION OF THE DRAWINGS

FIG. 5 lists voltages applied to the memory cell according to the present exemplary embodiment;

DETAILED DESCRIPTION OF PREFERRED EMBODIMENTS

An exemplary embodiment of the present invention will now be described with reference to the accompanying drawings. The exemplary embodiment below is not intended to unreasonably limit the scope of the invention as set out in the appended claims. Also, the present invention may be practiced without some of the specific elements described below.

1. General Operations

Figure 1:
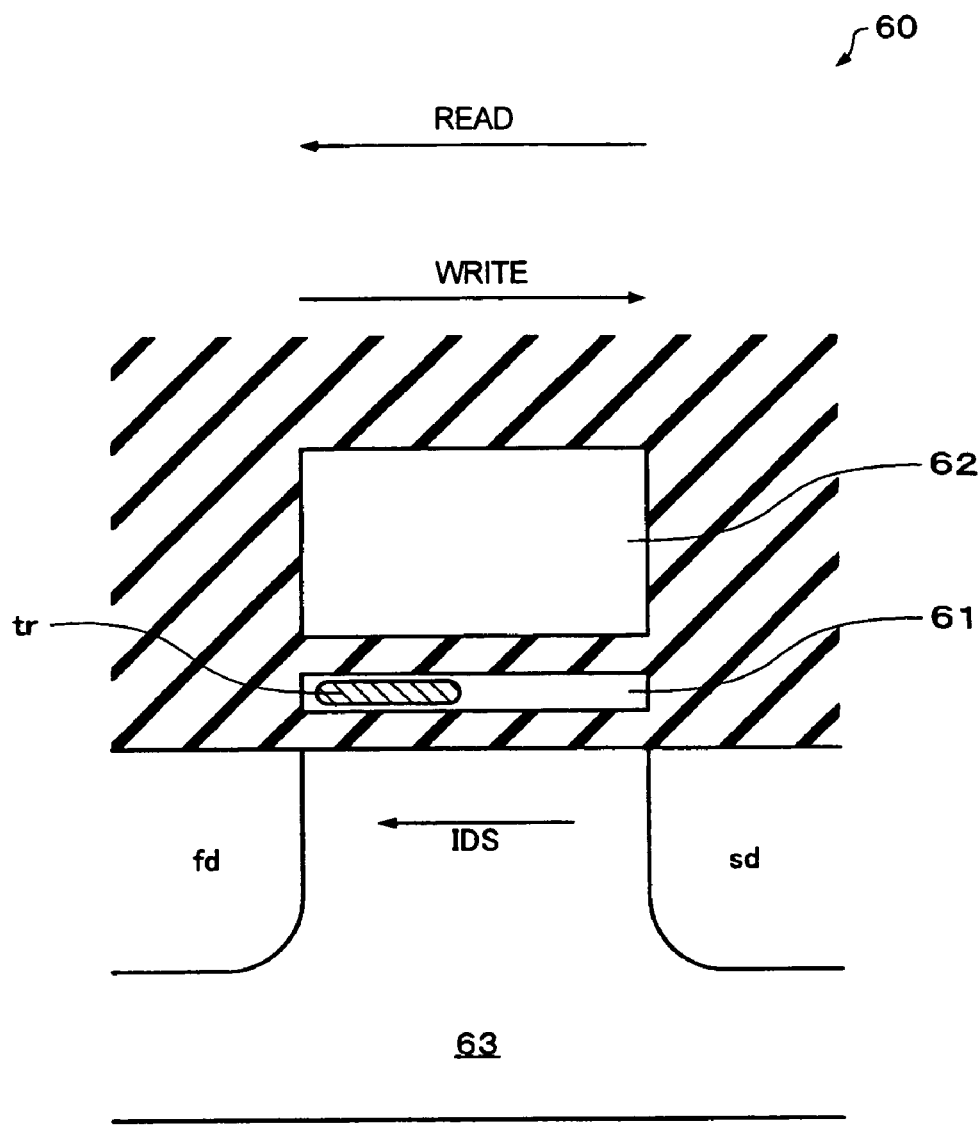
FIG. 1 is a schematic that shows a view of a memory cell.

Referring to FIG. 1, the general operations will now be described. FIG. 1 is a schematic that shows a view of a memory cell 60. The memory cell 60 includes a nitride film 61 (or a dielectric film in a broader sense), a trap region "tr", a gate electrode 62, a first impurity region "fd", a second impurity region "sd", and a substrate 63. A current indicated as "IDS" flows in a channel region between the first impurity region fd and the second impurity region sd. Referring to the drawings, like numerals indicate like elements throughout the views.

To perform a write operation (or data writing in a broader sense) in the memory cell 60, a write voltage (of 5.5 V, for example) is applied to the first impurity region fd. At the same time, the second impurity region sd is set to be a ground potential or in the floating state. Meanwhile, a selection voltage (of 11 V, for example) is applied to the gate electrode 62. Under this state, a channel is formed in the region between the first impurity region fd and the second impurity region sd, and electrons around the first impurity region fd are turned to be hot electrons by the write voltage applied to the first impurity region fd. Under the influence of the gate electrode 62 where the selection voltage is applied, the hot electrons tunneling an oxide film are trapped by the nitride film 61. Conversely, the nitride film 61 included in the memory cell 60 under a write operation traps these electrons.

To perform an erase operation (or data writing in a broader sense) in the memory cell 60, an erase voltage (of 8 V, for example) is applied to the first impurity region fd. At the same time, the second impurity region sd is set to be a ground potential or in the floating state. Meanwhile, an erase selection voltage (of 0 V, for example) is applied to the gate electrode 62. Under this state, a channel is formed in between the first impurity region fd and the second impurity region sd, and hot holes are developed around the first impurity region fd under the influence of the erase voltage applied to the first impurity region fd. If any electrons are trapped by the nitride film 61, the hot holes are coupled to the electrodes. Conversely, the nitride film 61 included in the memory cell 60 under an erase operation hardly traps electrons.

To perform a read operation (or data reading in a broader sense) in the memory cell 60, the first impurity region fd is set to be a ground potential or in the floating state. At the same time, a read voltage (of 2 V, for example) is applied to the second impurity region sd. Meanwhile, a read selection voltage (of 3 V, for example) is applied to the gate electrode 62. Under this state, the amount of the current IDS flowing in the channel region between the first impurity region fd and the second impurity region sd varies depending on the amount of electrons that are trapped by the nitride film 61. Detecting variations in the amount of the current IDS using a sense amplifier or the like enables the read operation in the memory cell 60. In other words, if the electrons trapped by the nitride film 61 are sufficiently abundant, gate threshold voltage of the memory cell 60 increases. If the gate threshold voltage is higher than the read selection voltage during a read operation, the current IDS will hardly flow.

According to the exemplary embodiments, the general operations (write, erase, and read) are performed.

2. General Structure

Figure 2:
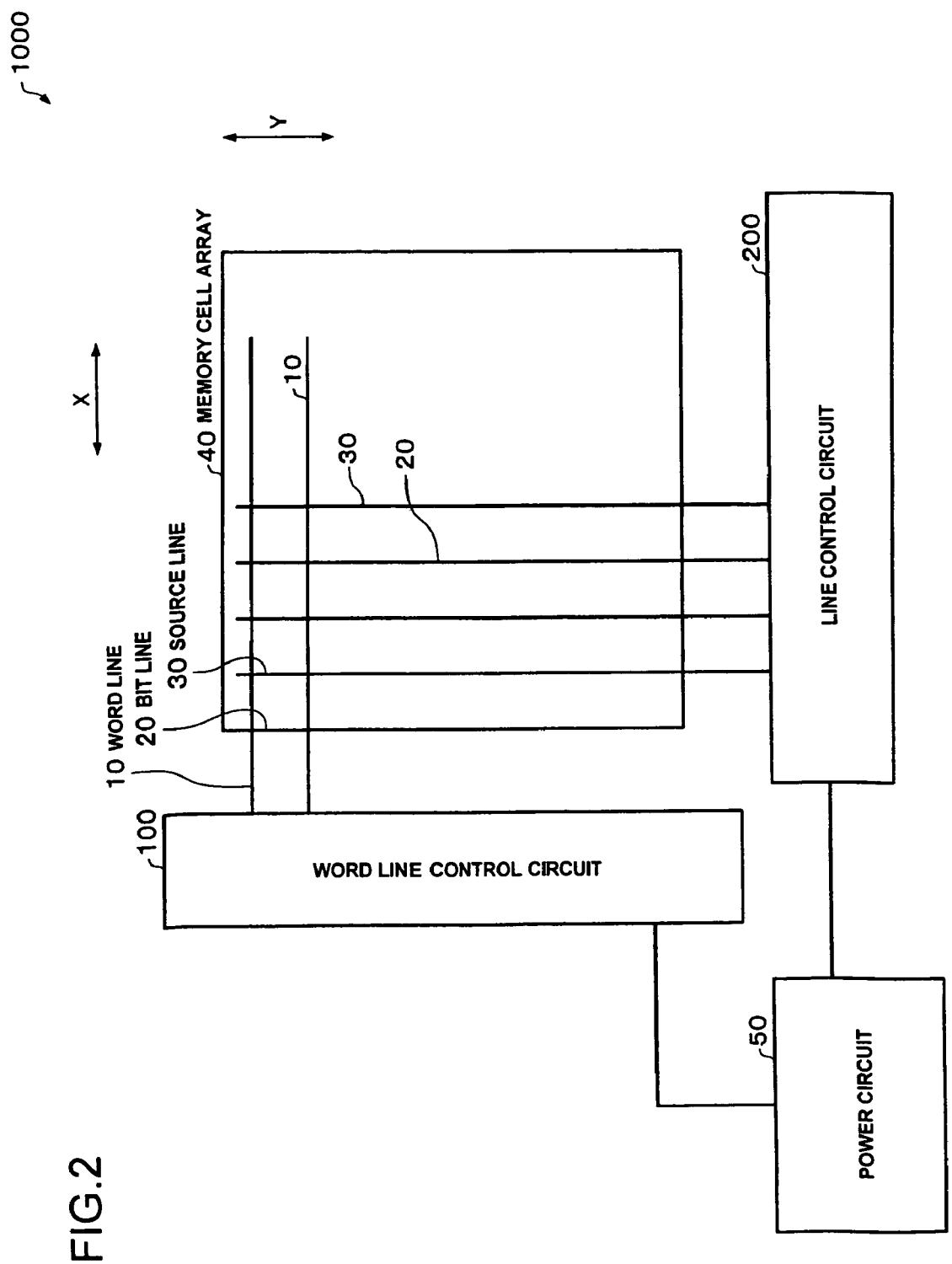
FIG. 2 is a schematic that shows a nonvolatile semiconductor memory according to one exemplary embodiment of the present invention.

FIG. 2 is a schematic that shows the structure of a nonvolatile semiconductor memory 1000. The nonvolatile semiconductor memory 1000 includes a word line control circuit 100, a line control circuit 200, and a power circuit 50. Coupled to the word line control circuit 100 is a plurality of word lines 10 that are aligned along the row X direction. Coupled to the line control circuit 200 is a plurality of bit lines 20 and a plurality of source lines 30 that are aligned along the column Y direction. The memory cell 60 shown in FIG. 1 is provided in the plural number in matrix form in a memory cell array 40.

Figure 3:
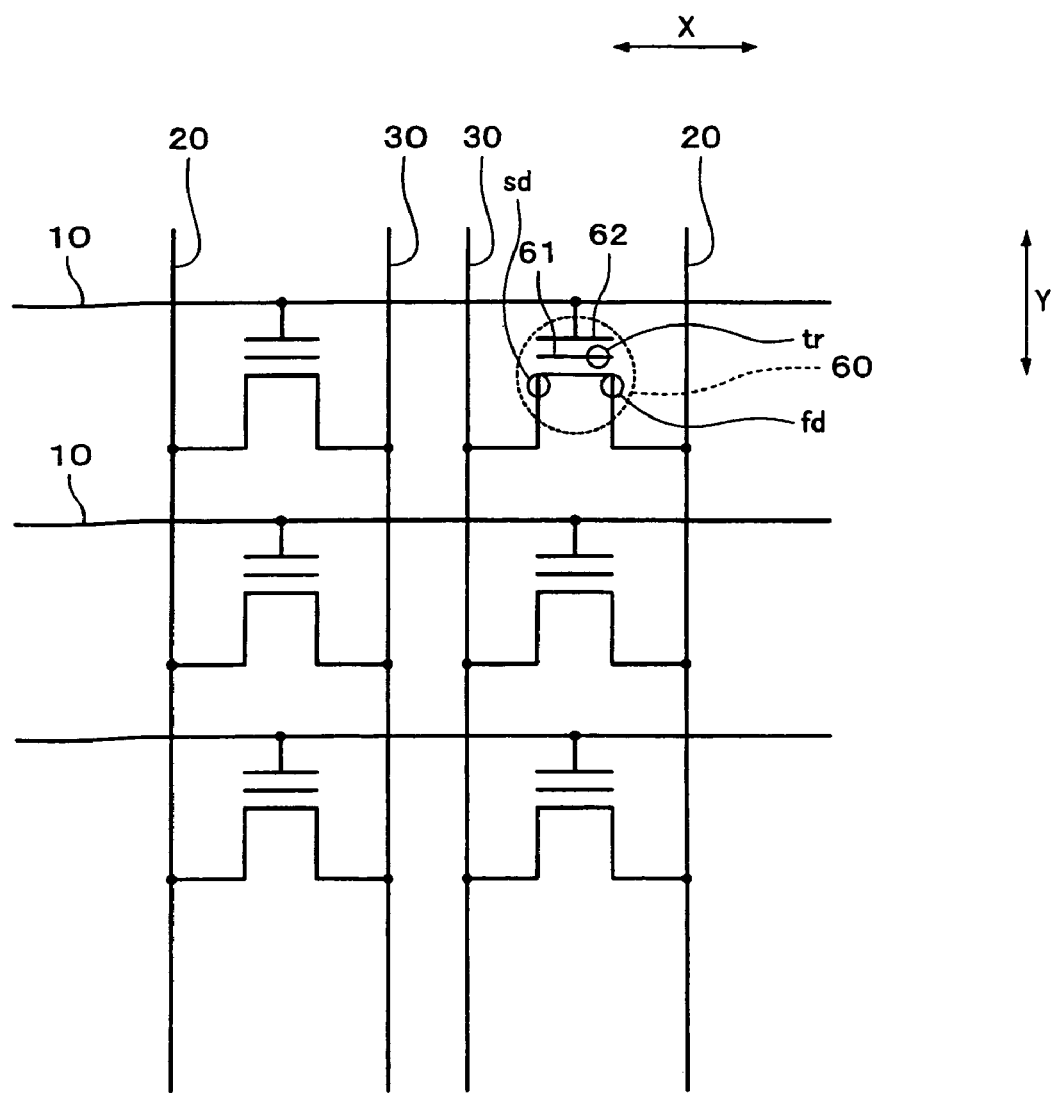
FIG. 3 is a schematic that shows connections inside the memory cell.

FIG. 3 is a schematic that shows part of the memory cell array 40. The gate electrode 62 of each memory cell 60 provided in the plural number in the row X direction is commonly coupled to one of the word lines 10. The first impurity region fd of each memory cell 60 provided in the plural number in the column Y direction is commonly coupled to one of the bit lines 20. The second impurity region sd of each memory cell 60 provided in the plural number in the column Y direction is commonly coupled to one of the source lines 30.

3. Operations Description

Figure 4:
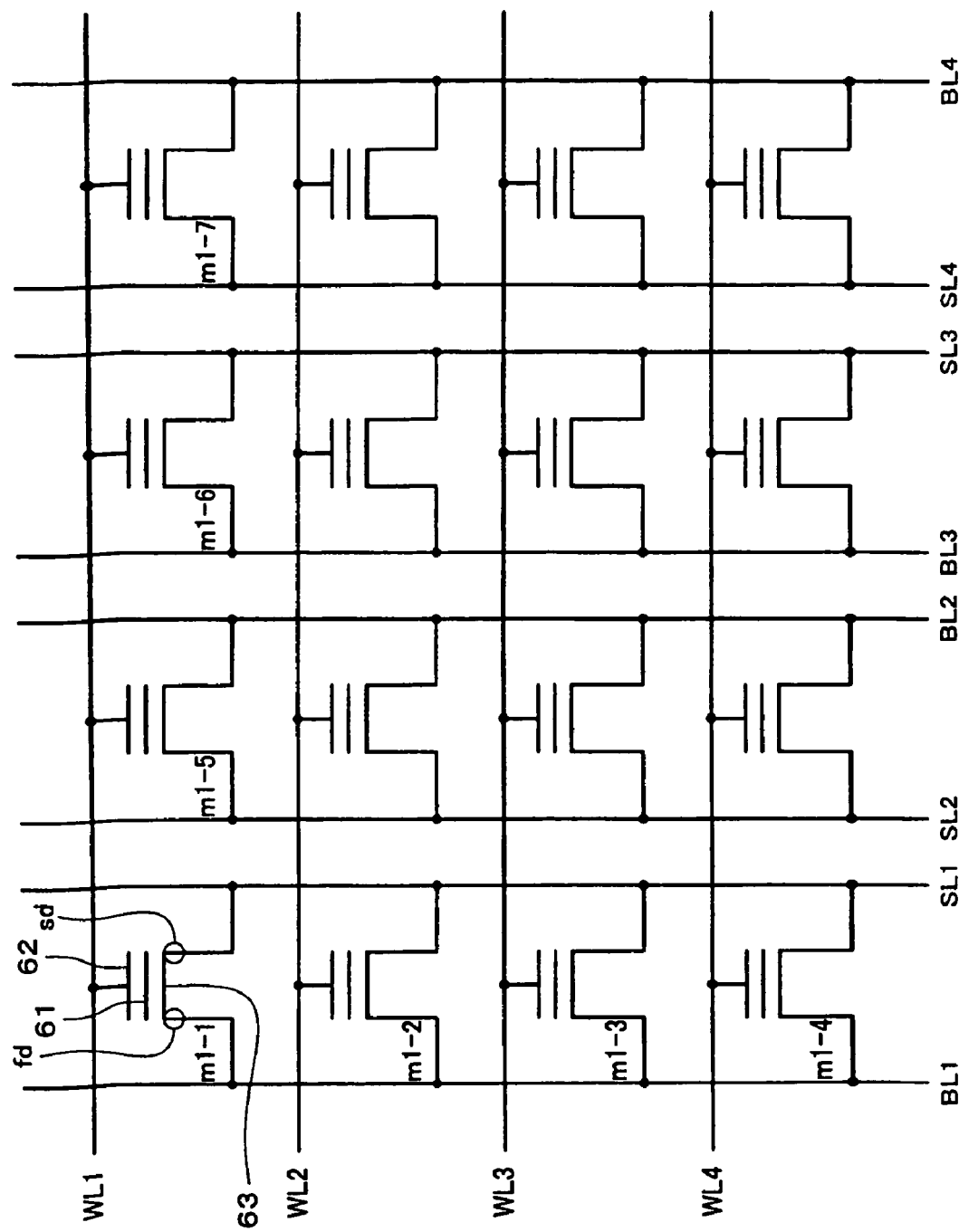
FIG. 4 is a schematic that shows one block included in the memory cell array according to the exemplary present embodiment.

Referring to FIG. 4, operational detail will now be described. FIG. 4 is a schematic that shows a block of the memory cell array 40. The drawing also shows word lines WL1 through 4 corresponding to the word lines 10, bit lines BL1 through 4 corresponding to the bit lines 20, source lines SL1 through 4 corresponding to the source lines 30, and memory cells m1-1 through 7 corresponding to the memory cell 60. FIG. 5 lists voltages applied to the word lines, the bit lines, and the source lines for each of the write, erase, and read operations.

3.1 Write Operation in the Memory Cell m1-1

In order to select the memory cell m1-1, the word line control circuit 100 supplies a selection voltage (of 11 V, for example, referring to FIG. 5) to the word line WL1. At the same time, an erase-error preventing voltage (of 0.5 V, for example, referring to FIG. 5) is supplied to the other word lines WL2 through 4 in the block. The line control circuit 200 supplies a write selection voltage (of 5.5V, for example, referring to FIG. 5) to the bit line BL1 that is coupled to the memory cell m1-1. The line control circuit 200 also supplies a write source voltage (of 0V, for example, referring to FIG. 5) to the source line SL1 that is coupled to the memory cell m1-1. At the same time, the line control circuit 200 sets each of the bit lines BL2 through 4 and each of the source lines SL2 through 4 in the block to be a ground potential. Alternatively, at least either each of the bit lines BL2 through 4 or each of the source lines SL2 through 4 may be set in the floating state.

According to the exemplary embodiment, a channel is formed in between the first impurity region fd and the second impurity region sd of the memory cell m1-1. Since the gate electrode 62 of the memory cell m1-1 is supplied with a selection voltage by the word line WL1, electrons in the channel tunnels an oxide film between the nitride film 61 and the substrate 63 and then are trapped by the nitride film 61. Thus, the memory cell m1-1 under this write operation is electronically written, which eventually means that data are written in it.

Each of the memory cells m1-2 through 4 (hereinafter called non-selected memories) as well as the memory cell m1-1 are coupled to the bit line BL1. Accordingly, the first impurity region fd of each of the memory cells m1-2 through 4 is supplied with the write selection voltage. However, since each of the word lines WL2 through 4 coupled to the memory cells m1-2 through 4, respectively, is supplied with the erase-error preventing voltage that is lower than the selection voltage, no electron tunnels in the memory cells m1-2 through 4. That is, the non-selected memories are not electronically written. This erase-error preventing voltage reduces or prevents erase errors in the non-selected memories, which will be described in greater detail below.

Each of the memory cells m1-5 through 7 as well as the memory cell m1-1 is coupled to the word line WL1. Accordingly, the gate electrode 62 of each of the memory cells m1-5 through 7 is supplied with the selection voltage. However, since each of the bit lines BL2 through 4 and each of the source lines SL2 through 4 coupled to the memory cells m1-5 through 7, respectively, is set to be a ground potential (or in the floating state), no hot electron is developed and no electron tunnels in the memory cells m1-5 through 7. This means that the memory cells m1-5 through 7 are not electronically written.

No data are written in any memory cell 60 that is not coupled to the word line WL1 nor to the bit line BL1 (hereinafter called completely non-selected memory cell). The gate electrode 62 of the completely non-selected memory cell is supplied with the erase-error preventing voltage by each of the word lines WL2 through 4. The first impurity region fd and the second impurity region sd of the completely non-selected memory cell are set to be a ground potential (or in the floating state). Accordingly, no electron tunnels in the completely non-selected memory cell.

3.2 Erase Operation

The erase operation will now be described. In the present exemplary embodiment, the erase operation means erasing electrons from the nitride film 61 included in the memory cell 60. The word lines WL1 through 4 are supplied with an erase selection voltage (of 0 V, for example, referring to FIG. 5). The bit lines BL1 through 4 are supplied with an erase voltage (of 8 V, for example, referring to FIG. 5). The source lines SL1 through 4 are set to be in the floating state, otherwise it may be set to be a ground potential.

Under this state, the erase operation is performed in every memory cell 60 in a block. Since the first impurity region fd of each memory cell 60 is supplied with the erase voltage, hot holes are developed around the first impurity region fd. At the same time, the gate electrode 62 of each memory cell 60 is supplied with the erase selection voltage. In the memory cell that is electrically written, the hot holes are under the influence of the erase selection voltage and injected into the nitride film 61 included in the memory cell 60. Consequently, the hot holes cancel electrons in the nitride film 61, making the memory cell 60 trap almost no electrons. This way the erase operation (or data writing in a broader sense) is performed.

In the present exemplary embodiment, the erase operation is performed by block as an example. This means that the erase operation is performed for every memory cell 60 in a block all at once. Alternatively, the erase operation may be performed for one memory cell 60.

3.3 Read Operation in the Memory Cell m1-1

The read operation will now be described. The word line WL1 coupled to the gate electrode 62 of the memory cell m1-1, i.e. selected memory cell, is supplied with a read selection voltage (of 3 V, for example, referring to FIG. 5). The other word lines WL2 through 4 are supplied with a non-selection voltage (of 0 V, for example, referring to FIG. 5). Each of the bit lines BL1 through 4 is set to be a ground potential. Alternatively, each of the bit lines BL1 through 4 may be set to be in the floating state. The source line SL1 coupled to the selected memory cell is supplied with a read voltage (of 2 V, for example, referring to FIG. 5), while the other source lines SL2 through 4 are set to be a ground potential. Alternatively, the source lines SL2 through 4 may be set to be in the floating state.

Under this state, the read operation is performed by detecting the current IDS flowing between the bit line BL1 and the source line SL1 coupled to the selected memory cell. If no electron is trapped by the nitride film 61 in the selected memory cell, a channel is formed between the first impurity region fd and the second impurity region sd of the selected memory cell under the influence of the read selection voltage, making the current IDS flow. If electrons are trapped by the nitride film 61 in the selected memory cell, gate threshold voltage of the selected memory cell increases. The read selection voltage is set lower than the gate threshold voltage, making the current IDS flowing between the first impurity region fd and the second impurity region sd of the selected memory cell significantly low. Here, data are measured by amplifying the current IDS, which varies depending on the amount of electrons in the nitride film 61, with a sense amplifier or the like.

Meanwhile, each of the memory cells m1-2 through 4, i.e. non-selected memories, as well as the memory cell m1-1 are coupled to the source line SL1. Accordingly, the second impurity region sd of each of the memory cells m1-2 through 4 is supplied with the read voltage. However, since each of the word lines WL2 through 4 coupled to the memory cells m1-2 through 4, respectively, is supplied with the non-selection voltage (of 0 V, for example), the current IDS hardly flows and no electron tunnels in the memory cells m1-2 through 4.

Each of the memory cells m1-5 through 7 as well as the memory cell m1-1 is coupled to the word line WL1. Accordingly, the gate electrode 62 of each of the memory cells m1-5 through 7 is supplied with the read selection voltage. However, since each of the bit lines BL2 through 4 and each of the source lines SL2 through 4 coupled to the memory cells m1-5 through 7, respectively, is set to be a ground potential (or in the floating state), the current IDS hardly flows and electrons hardly tunnel in the memory cells m1-5 through 7.

The gate electrode 62 of the memory cell 60 that is a completely non-selected memory cell is supplied with the non-selection voltage by each of the word lines WL2 through 4. The first impurity region fd and the second impurity region sd of the completely non-selected memory cell are set to be a ground potential or in the floating state. Accordingly, the current IDS hardly flows in the completely non-selected memory cell.

4. Effects in Comparison with Conventional Methods

Figure 6:
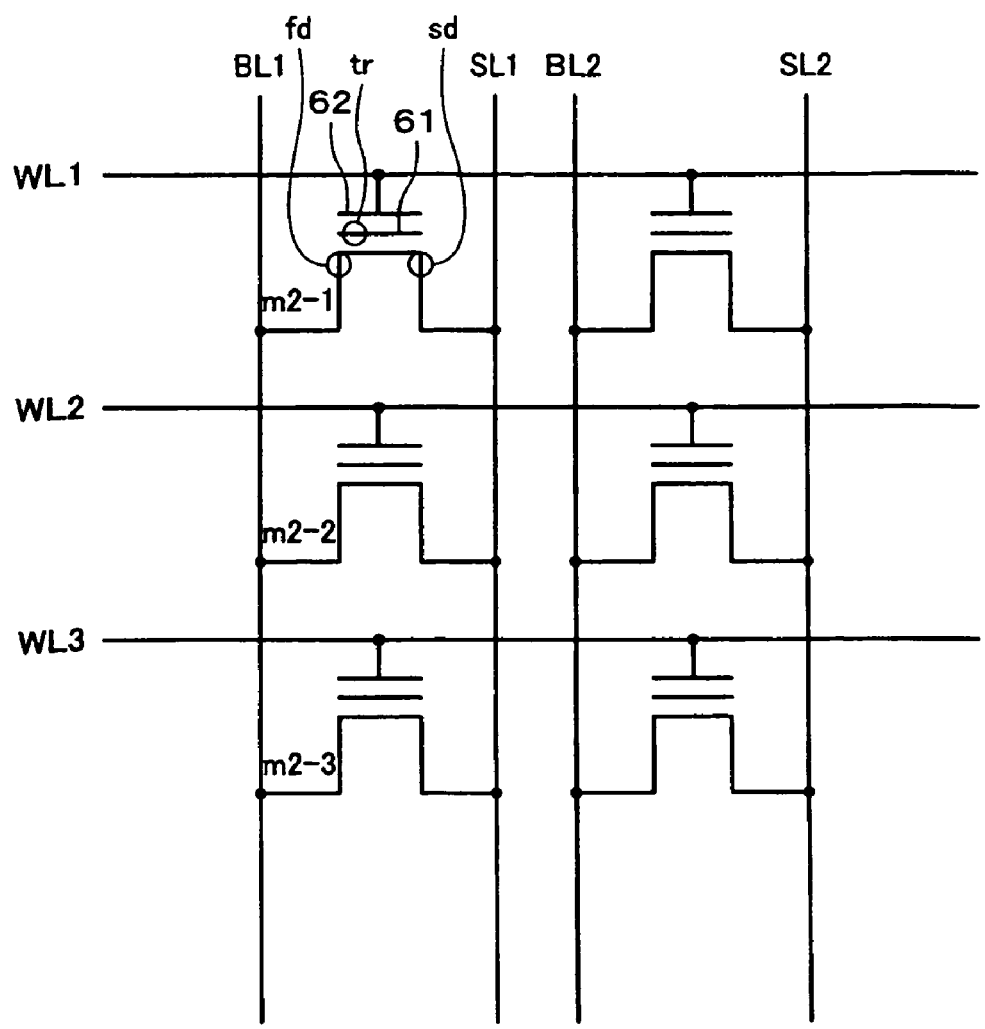
FIG. 6 is a schematic that shows part of a memory cell array of a related art example.

Referring to FIG. 6, an example of conventional methods will now be described. FIG. 6 is a schematic that shows part of a memory cell array of a related art example. The memory cell array includes memory cells m2-1 through 3. The gate electrode 62 of each of the memory cells m2-1 through 3 is coupled to the word lines WL1 through 3, respectively. The first impurity region fd and the second impurity region sd of each of the memory cells m2-1 through 3 are coupled to the bit line BL1 and the source line SL1, respectively.

When the write operation is performed in the memory cell m2-1, the word lines WL1 is supplied with a voltage of 11 V. At the same time, a voltage of 5.5 V is applied to the bit line BL1. The other word lines WL2 and 3, the bit line BL2, and the source lines SL1 and 2 are supplied with a voltage of 0 V. Then, the memory cell m2-1 is electrically written in the above-mentioned manner of the general operations. This related art method, however, involves the following problem.

Under this state, the voltage of 5.5 V, which is applied to the bit line BL1, becomes a disturbing voltage to the memory cells m2-2 and 3. The bit line BL1 causes hot holes around the first impurity region fd of each of the memory cells m2-2 and 3. If electrons are trapped in any of the memory cell m2-2 or 3, the hot holes developed around the first impurity region fd are injected into the nitride film 61. Accordingly, the injected hot holes bind to the trapped electrons, reducing the amount of the electrons trapped by the nitride film 61. In the worst scenario, this possibly causes what the erase operation brings in the memory cell.

Figure 7:
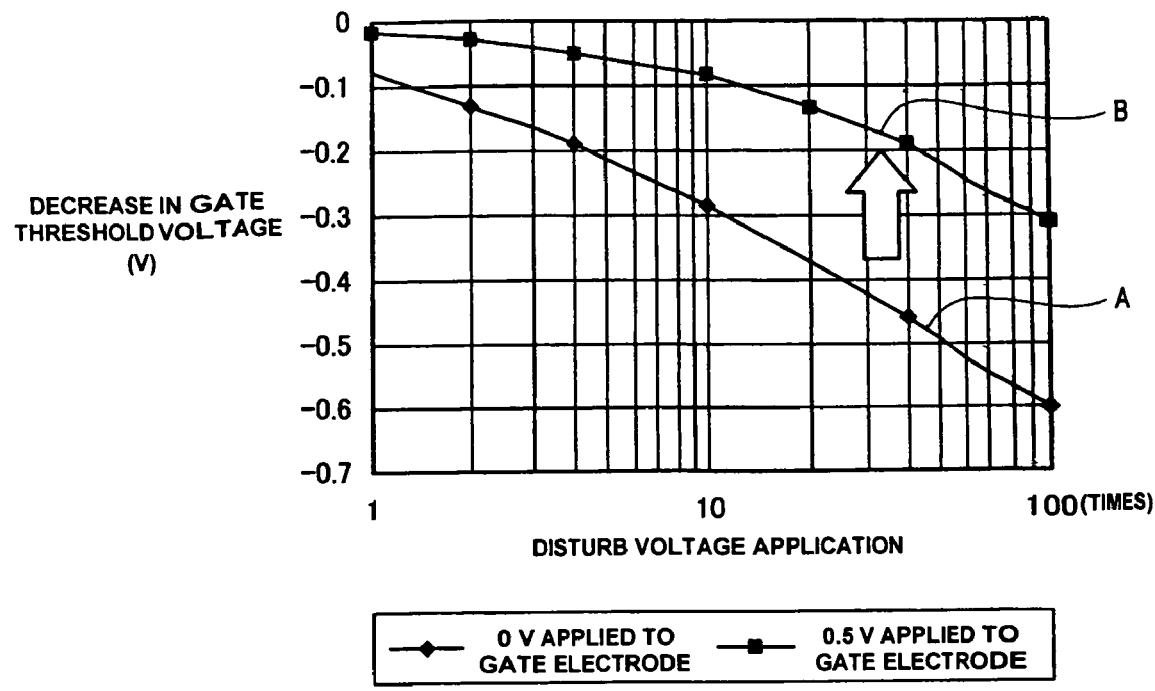
FIG. 7 is a graph that shows reduction in gate threshold voltage due to disturbing voltage.

FIG. 7 is a graph showing measured data of the relationship between the number of applying such disturbing voltage and gate threshold voltage of the memory cell. In measuring the data, a disturbing voltage of 5 V was applied for 100 microseconds each time to the first impurity region fd of the memory cell that has been written. The data show that the more the disturbing voltage was applied, the lower the gate threshold voltage of the memory cell became. In the graph, the vertical axis shows a decrease in the gate threshold voltage, and the horizontal axis shows the number of applying the disturbing voltage. Here, the data were measured with the second impurity region sd being set to be a ground potential.

The line A in FIG. 7 is a curved line showing a decrease in the gate threshold voltage of the memory cell when applying a voltage of 0 V to the gate electrode 62 of the memory cell. This decrease is apparently attributed to the decreasing gate threshold voltage of the memory cells m2-2 and 3 shown in FIG. 6 when the write operation is continuously performed in the memory cell m2-1 in FIG. 6 in the related art manner.

The line B in FIG. 7 is a curved line showing a decrease in the gate threshold voltage of the memory cell when applying a voltage of 0.5 V to the gate electrode 62 of the memory cell. This decrease is apparently attributed to the decreasing gate threshold voltage of the memory cells m1-2 through 4 shown in FIG. 4 when the write operation is continuously performed in the memory cell m1-1 in FIG. 4 according to the present exemplary embodiment.

Referring to FIG. 7, the line A of the related art method shows a decrease of 0.6 V in the gate threshold voltage after applying the disturbing voltage 100 times. Meanwhile, the line B of the present exemplary embodiment, in which the erase-error preventing voltage (of 0.5 V referring to FIG. 7) is applied, shows a decrease of as little as 0.3 V in the gate threshold voltage after applying the disturbing voltage 100 times. This shows that the present exemplary embodiment provides more resistance to the disturbing voltage than the related art method. Increasing the number of memory cells within a block to achieve higher packaging density means the increasing number of applying disturbing voltage to each memory cell. The present exemplary embodiment, however, provides excellent resistance to the disturbing voltage, making it possible to increase the number of memory cells within a block.

Moreover, the present exemplary embodiment provides high speed access. The related art method requires to consider a decrease in the gate threshold voltage, due to the disturbing voltage, which should be incorporated as a design margin. This means that extra time for applying a voltage in the write operation needs to be taken in order to prevent read errors. Although the margin for coping with the decrease in the gate threshold voltage can be thus set, the related art method has a problem of low access speed.

Meanwhile, the present exemplary embodiment reduces a decrease in the gate threshold voltage of each memory cell, making it possible to eliminate extra write time to set the margin for coping with a decrease in the gate threshold voltage. Accordingly, time for applying voltage during the write operation can be reduced and access speed can be increased.

In addition to the above-mentioned effects, the present exemplary embodiment is applicable to various array configurations. Next, exemplary modifications of the present exemplary embodiment will be described.

5. Erase-Error Preventing Voltage

Figure 8:
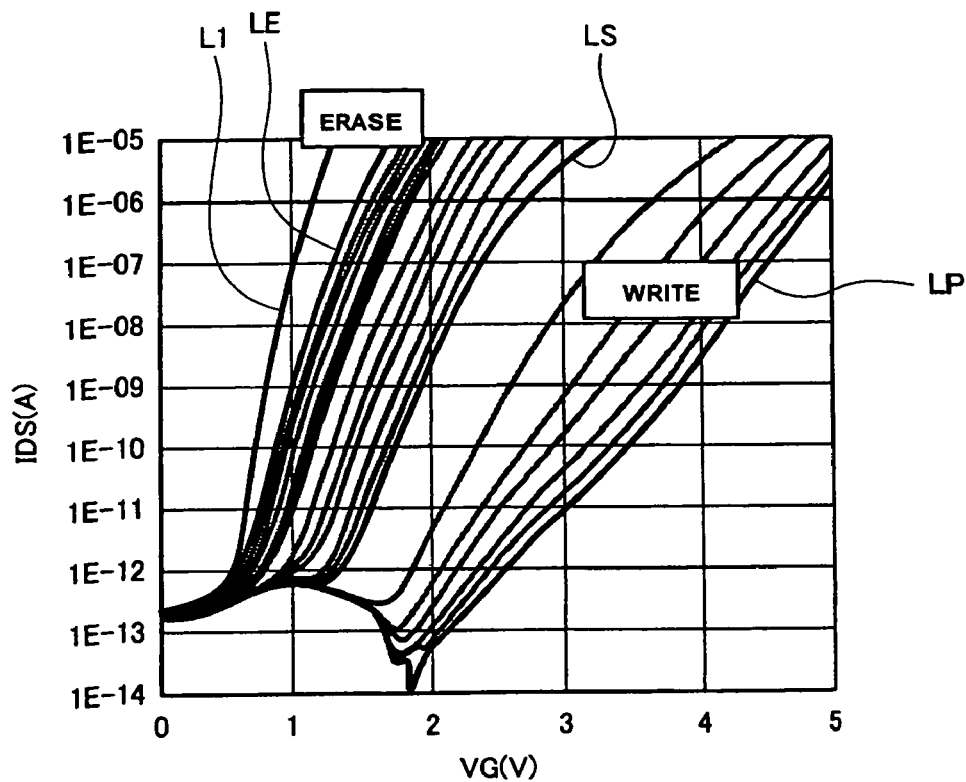
FIG. 8 is a graph that shows the relationship between a current IDS and a gate threshold voltage VG.

Referring now to FIG. 8, values of the erase-error preventing voltage will be described. FIG. 8 is a graph of curved lines. In measuring data of the curved lines, the write operation was performed in a memory cell for several times to reach the state with the memory cell being fully electronically written, and then the erase operation was performed. Each curved line shows the measured amount of the current IDS flowing between the first impurity region fd and the second impurity region sd varying in line with a voltage VG applied to the gate electrode 62 of a memory cell in which the write or erase operation has been performed for a unit of time (about one microsecond). The curved line L1 shows the relationship between the voltage VG and the current IDS in an initial condition where neither write nor erase operation has been performed. In this condition, the amount of electrons trapped by the nitride film 61 is unknown.

In addition to the condition of the curved line L1, the write operation was performed for a unit of time (about one microsecond), that is, applying a voltage of 5 V to the first impurity region fd, a voltage of 0 V to the second impurity region sd, and a voltage of 7 V to the gate electrode 62. The curved line L2 shows the relationship between the voltage VG applied to the gate electrode and the current IDS under this state of things. This cycle was repeated for several times until the curved line LP was finally obtained. The curved line LP shows the state with the memory cell being fully electronically written.

Subsequently, the erase operation was performed in the memory cell for a unit of time (about one microsecond), and the relationship between the voltage VG applied to the gate electrode and the current IDS was measured. Further erase operation for a unit of time (about one microsecond) followed this, and again the relationship between the voltage VG applied to the gate electrode and the current IDS was measured. This cycle was repeated until the curved line LE was finally obtained. The curved line LE shows the state with the electrons being erased to the utmost.

The curved lines show that the amount of electrons that are written during the write operation and are erased during the erase operation can be controlled by adjusting the time for applying voltage. Furthermore, they also show that the gate threshold voltage can be desirably set by adjusting the balance between the amount of electrodes that are written and of electrodes that are erased.

The erase-error preventing voltage is set to be a positive voltage lower than the selection voltage supplied to a selected word line, in order to reduce or prevent write errors to non-selected memory cells during the write operation. The erase-error preventing voltage may be set to be a positive voltage lower than the gate threshold voltage of the memory cell in which the write operation has been performed. Moreover, the erase-error preventing voltage may be set to be a positive voltage lower than the gate threshold voltage of the memory cell in which the erase operation has been performed. Accordingly, the erase-error preventing voltage is set to reduce the gate threshold voltage to the non-selected memory cells or reduce or prevent erase errors without causing any write errors. If the relationship between the current IDS and the gate threshold voltage of the memory cell to which the erase operation has been performed, is like the one indicated by the curved line LS, the erase-error preventing voltage can be set, for example, around 1 V. If the erase-error preventing voltage is set to be positive voltage (of 0.5 V, for example) that is lower than the gate threshold voltage of the memory cell from which electrons have been erased to the utmost, it is possible to reduce the gate threshold voltage to the non-selected memory cells or reduce or prevent erase errors without causing any write errors to each memory cell 60 included in the memory cell array 40.

6. Modifications

Figure 9:
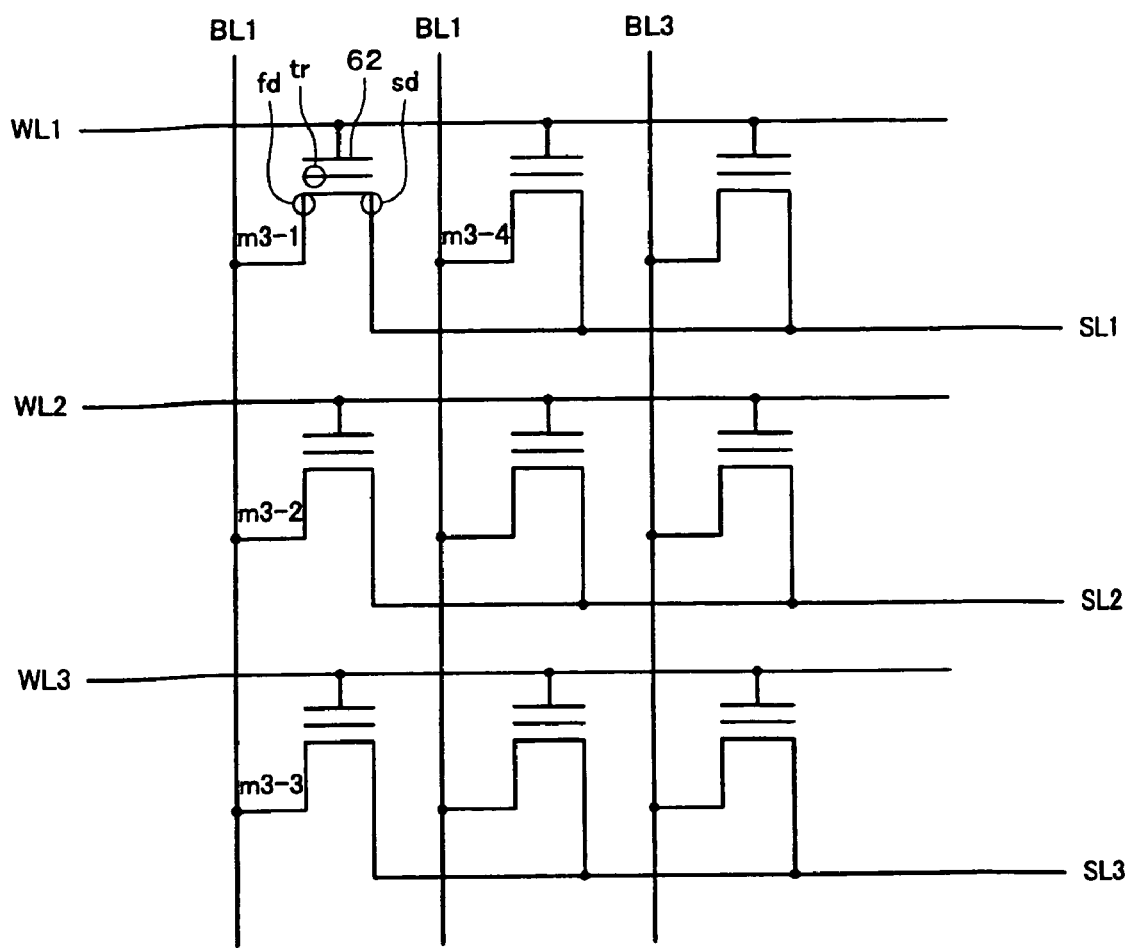
FIG. 9 is a schematic that shows a circuit of a first exemplary modification of the present exemplary embodiment.

FIG. 9 is a circuit diagram showing a memory cell array of a first exemplary modification of the present exemplary embodiment. The diagram shows memory cells m3-1 through 3 corresponding to the memory cell 60.

The write operation in the memory cell m3-1 will now be explained. To select the memory cell m3-1, the word line WL1 is supplied with a selection voltage (of 11 V, for example). The other word lines WL2 and 3 are supplied with an erase-error preventing voltage (of 0.5 V, for example). The bit line BL1 coupled to the memory cell m3-1 is supplied with a write selection voltage (of 5.5 V, for example). The source line SL1 coupled to the memory cell m3-1 is supplied with a write source voltage (of 0 V, for example). At the same time, each of the bit lines BL2 and 3 and each of the source lines SL2 and 3 in the block is set to be a ground potential. Alternatively, at least either each of the bit lines BL2 and 3 or each of the source lines SL2 and 3 may be set in the floating state.

The memory cell m3-1 is written under this state. Meanwhile, each of the memory cells m3-2 and 3 as well as the memory cell m3-1 is coupled to the bit line BL1. Accordingly, the first impurity region fd of each of the memory cells m3-2 and 3 is supplied with the write selection voltage. However, since each of the word lines WL2 and 3 coupled to the memory cells m3-2 and 3, respectively, is supplied with the erase-error preventing voltage that is lower than the selection voltage, no electron tunnels in the memory cells m3-2 and 3. This means that the memory cells m3-2 and 3 are not electronically written. The erase-error preventing voltage also reduces or prevents erase errors in the memory cells m3-2 and 3, and reduces disturbing voltage that erases electrons in the trap region tr of each of the memory cells m3-2 and 3.

Figure 10:
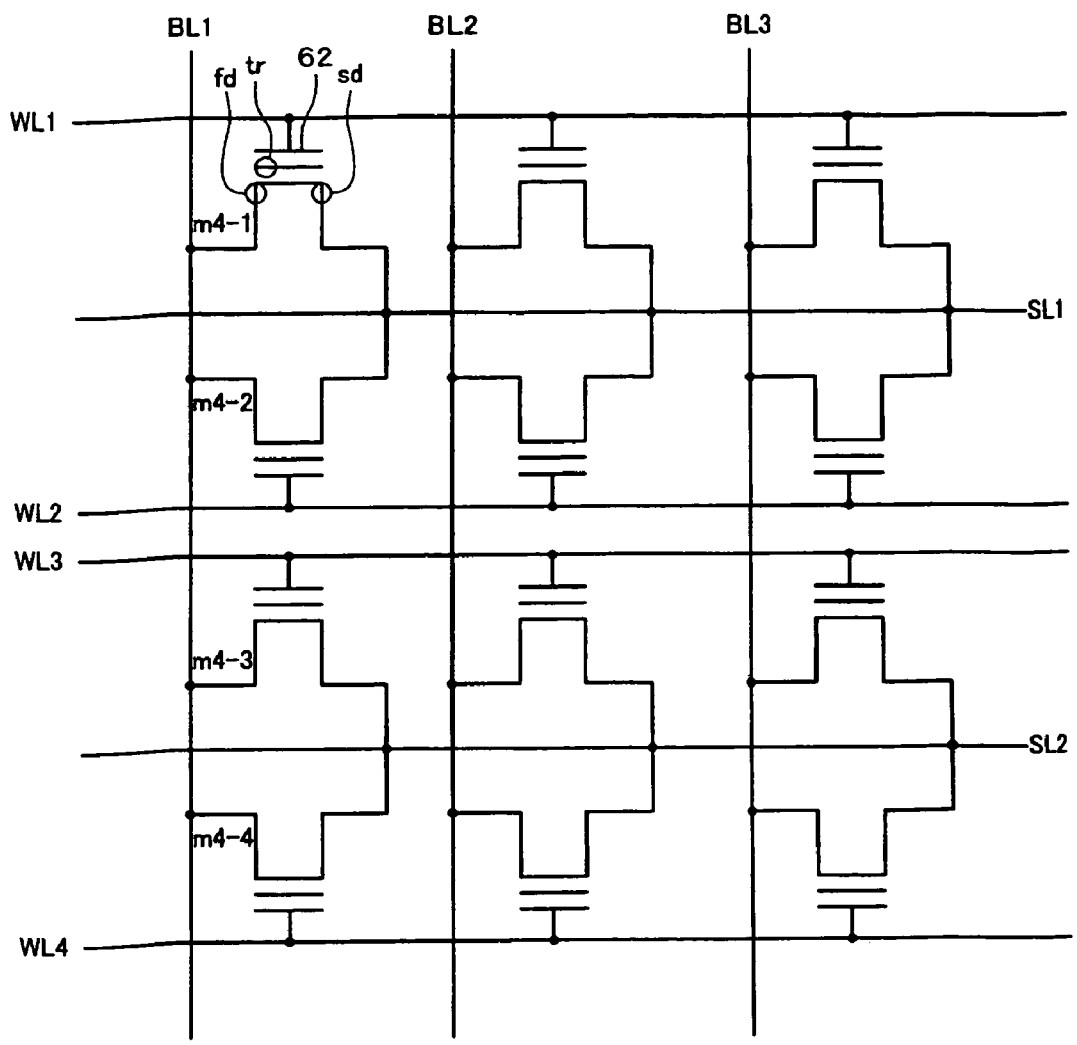
FIG. 10 is a schematic that shows a circuit of a second exemplary modification of the present exemplary embodiment.

FIG. 10 is a schematic that shows a circuit of a memory cell array of a second exemplary modification of the present exemplary embodiment. The diagram shows memory cells m4-1 through 4 corresponding to the memory cell 60.

The write operation in the memory cell m4-1 will now be explained. To select the memory cell m4-1, the word line WL1 is supplied with a selection voltage (of 11 V, for example). The other word lines WL2 through 4 are supplied with an erase-error preventing voltage (of 0.5 V, for example). The bit line BL1 coupled to the memory cell m4-1 is supplied with a write selection voltage (of 5.5 V, for example). The source line SL1 coupled to the memory cell m4-1 is supplied with a write source voltage (of 0 V, for example). At the same time, each of the bit lines BL2 and 3 and the source line SL2 is set to be a ground potential. Alternatively, at least either each of the bit lines BL2 and 3 or the source line SL2 may be set in the floating state.

The memory cell m4-1 is written under this state. Meanwhile, each of the memory cells m4-2 through 4 as well as the memory cell m4-1 is coupled to the bit line BL1. Accordingly, the first impurity region fd of each of the memory cells m4-2 through 4 is supplied with the write selection voltage. However, since each of the word lines WL2 through 4 coupled to the memory cells m4-2 through 4, respectively, is supplied with the erase-error preventing voltage that is lower than the selection voltage, no electron is written in the memory cells m4-2 through 4 like in the first exemplary modification. The erase-error preventing voltage also reduces or prevents erase errors in the memory cells m4-2 through 4, and reduces disturbing voltage that erases electrons in the trap region tr in each of the memory cells m4-2 through 4.

As mentioned above, the present exemplary embodiment is applicable to memory cell arrays with various array configurations.

7. Specific Examples

Figure 11:
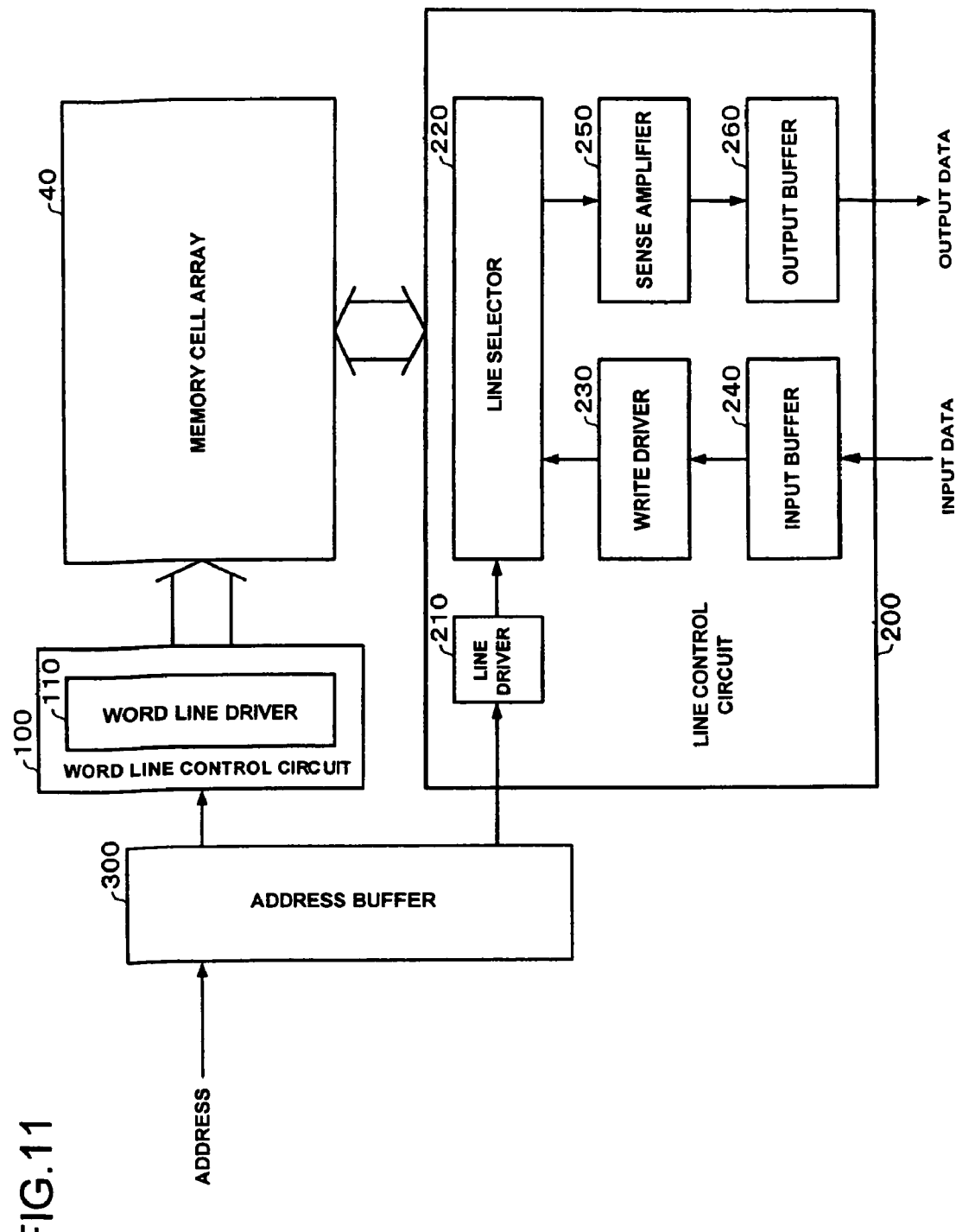
FIG. 11 is a schematic that shows a specific example of the present exemplary embodiment.

FIG. 11 shows a specific example of the present exemplary embodiment. The drawing shows a nonvolatile memory 2000 including a word line driver 110, a line driver 210, a line selector 220, a write driver 230, an input buffer 240, a sense amplifier 250, an output buffer 260, and an address buffer 300.

The word line control circuit 100 includes the word line driver 110. The line control circuit 200 includes the line driver 210, the line selector 220, the write driver 230, the input buffer 240, the sense amplifier 250, and the output buffer 260. This configuration is given as an example, and any of the line driver 210, the line selector 220, the write driver 230, the input buffer 240, the sense amplifier 250, and the output buffer 260 may be provided outside the line control circuit 200.

Write Operation

During the write operation, address information and input data are supplied to the nonvolatile memory 2000 from external sources. The supplied address information is buffered by the address buffer 300. The buffered address information is supplied to the word line control circuit 100 and the line control circuit 200. The supplied input data are buffered by the input buffer 240 included in the line control circuit 200. The buffered input data are supplied to the write driver 230.

The word line control circuit 100 controls the word line driver 110 based on the supplied address information. The word line driver 110 selects a selected word line out of the word lines aligned in the memory cell array 40, and supplies a selection voltage (of 11 V, for example) to the selected word line. The word line driver 110 supplies an erase-error preventing voltage (of 0.5 V, for example) to the other word lines.

Meanwhile, the line selector 220 supplies desired voltage to an associated bit line and source line out of the bit lines and the source lines that are aligned in the memory cell array 40. More specifically, the line selector 220 supplies a selection bit line voltage (of 5.5 V, for example) to the associated bit line and a selection source voltage (of 0 V, for example) to the associated source line. The other bit lines and source lines are set to be a ground potential. Alternatively, the other bit lines and source lines may be set to be in the floating state. This state allows the write operation in the selected memory cell.

Erase Operation

In the erase operation of this example, data in a block are erased all at once. The word line control circuit 100 supplies an erase selection voltage (of 0 V, for example) to the word lines in the block. The line control circuit supplies an erase voltage (of 8 V, for example) to the bit lines in the block. Each of the source lines 30 in the block is set to be a ground potential. Alternatively, each of the source lines 30 may be set to be in the floating state. This state allows the erase operation.

Read Operation

During the read operation, address information is supplied to the nonvolatile memory 2000 from an external source. Like in the write operation, the address information is supplied to the word line control circuit 100 and the line control circuit 200. Then the word line control circuit 100 controls the word line driver 110 based on the supplied address information. The word line driver 110 selects a desired word line out of the word lines aligned in the memory cell array 40, and supplies a read selection voltage (of 3 V, for example) to the word line. The word line driver 110 also supplies a non-selection voltage (of 0 V, for example) to the other word lines. The other word lines may be set to be a ground potential or in the floating state.

Meanwhile, the line selector 220 supplies a read voltage (of 2 V, for example) to an associated source line out of the source lines 30 aligned in the memory cell array 40. At the same time, each of the bit lines 20 and the other source lines are set to be a ground potential. Alternatively, each of the bit lines 20 and the other source lines 30 may be set to be in the floating state. This state allows the read operation.

What is claimed is:

1. A nonvolatile semiconductor memory, comprising:
a memory cell array including a plurality of memory cells provided in matrix form, a plurality of word lines, a plurality of bit lines, and a plurality of source lines;
a word line control circuit to control the plurality of word lines; and
a line control circuit to control the plurality of bit lines and the plurality of source lines;
each of the plurality of memory cells including a gate electrode coupled to the word lines, a first impurity region coupled to the bit lines, a second impurity region coupled to the source lines, and an electron trap region provided in between the gate electrode and a substrate, the electron trap region being provided at least on the first impurity region side of the first impurity region side and the second impurity region side; and
the word line control circuit, during a write operation in a selected memory cell, supplying a selection voltage to a selected word line coupled to the selected memory cell and supplying an erase-error preventing voltage to a non-selected word line coupled to each non-selected memory cell commonly coupled to a bit line that is coupled to the selected memory cell.

2. The nonvolatile semiconductor memory according to claim 1, the word line control circuit supplying a positive voltage that is lower than the selection voltage as the erase-error preventing voltage.

3. The nonvolatile semiconductor memory according to claim 1, the word line control circuit supplying a voltage that is lower than a gate threshold voltage of a memory cell under a write operation as the erase-error preventing voltage.

4. The nonvolatile semiconductor memory according to claim 1, the word line control circuit supplying a voltage that is lower than a gate threshold voltage of a memory cell under an erase operation as the erase-error preventing voltage.

5. The nonvolatile semiconductor memory according to claim 1, during an erase operation in the selected memory cell, the word line control circuit supplying an erase voltage that is lower than the erase-error preventing voltage to a word line coupled to the selected memory cell.

6. The nonvolatile semiconductor memory according to claim 1, the trap region being formed in dielectric film provided in between a first oxide film and a second oxide film.

7. The nonvolatile semiconductor memory according to claim 6, the dielectric film being a nitride film.

8. The nonvolatile semiconductor memory according to claim 1, the trap region being formed in a silicon dot region provided in between a first oxide film and a second oxide film.

9. The nonvolatile semiconductor memory according to claim 1, the line control circuit, during a write operation in a selected memory cell, supplying a write selection voltage to a selected bit line coupled to the selected memory cell and setting a ground potential or a floating state to a non-selected bit line coupled to each non-selected memory cell commonly coupled to the selected word line.

10. The nonvolatile semiconductor memory according to claim 1, the line control circuit, during a write operation in a selected memory cell, supplying a write source voltage to a selected source line coupled to the selected memory cell and setting a ground potential or a floating state to a non-selected source line coupled to each non-selected memory cell commonly coupled to the selected word line.

11. A method for controlling a nonvolatile semiconductor memory, comprising:

supplying a selection voltage, during a write operation in a selected memory cell, to a gate electrode of the selected memory cell and supplying an erase-error preventing voltage to a gate electrode of each non-selected memory cell commonly coupled to a bit line that is coupled to the selected memory cell;

providing the nonvolatile semiconductor memory with a memory cell array including a plurality of memory cells provided in matrix form, a plurality of word lines, a plurality of bit lines, and a plurality of source lines; and each of the plurality of memory cells including the gate electrode coupled to the word lines, a first impurity region coupled to the bit lines, a second impurity region coupled to the source lines, and an electron trap region provided in between the gate electrode and a substrate, the electron trap region being provided at least on the first impurity region side of the first impurity region side and the second impurity region side.

12. The method for controlling a nonvolatile semiconductor memory according to claim 11, further including supplying a positive voltage that is lower than the selection voltage as the erase-error preventing voltage.

13. The method for controlling a nonvolatile semiconductor memory according to claim 11, further including supplying a voltage that is lower than a gate threshold voltage of a memory cell under a write operation, as the erase-error preventing voltage.

14. The method for controlling a nonvolatile semiconductor memory according to claim 11, further including supplying a voltage that is lower than a gate threshold voltage of a memory cell under an erase operation, as the erase-error preventing voltage.

15. The method for controlling a nonvolatile semiconductor memory according to claim 11, further including supplying during an erase operation in the selected memory cell, an erase voltage that is lower than the erase-error preventing voltage to a word line coupled to the selected memory cell.

* * * * *